United States Patent [19]

Hag et al.

[11] Patent Number: 4,719,602
[45] Date of Patent: Jan. 12, 1988

[54] MEMORY WITH IMPROVED COLUMN ACCESS

[75] Inventors: Mohammed E. U. Hag, Sunnyvale; Peter J. Bagnall, Cupertino, both of Calif.

[73] Assignee: Visic, Inc., San Jose, Calif.

[21] Appl. No.: 699,020

[22] Filed: Feb. 7, 1985

[51] Int. Cl.⁴ .............................................. G11C 8/00
[52] U.S. Cl. ..................................... 365/230; 365/200
[58] Field of Search ....................... 365/189, 200, 230

[56] References Cited

U.S. PATENT DOCUMENTS

| 4,344,156 | 8/1982 | Eaton, Jr. et al. | 365/189 |
| 4,396,845 | 8/1983 | Nakano | 365/230 |
| 4,616,347 | 10/1986 | Bernstein | 365/230 |

Primary Examiner—James W. Moffitt
Attorney, Agent, or Firm—Flehr, Hohbach, Test, Albritton & Herbert

[57] ABSTRACT

A semiconductor memory device having an improved system for randomly accessing a preselected set of memory locations. The invention includes a set of "secondary sense amplifiers" which act as a high speed buffer between the memory's normal sense amplifiers and the memory's data input and output buffers. The secondary sense amplifiers are connected to selected ones of the sense amplifiers in accordance with a first predefined subset of the memory's column address signals. A decoder circuit, which is directly responsive to a second predefined subset of the column address signals, selects one of the secondary sense amplifiers and connects it to the memory's data input and output buffers. Since the decoder is directly responsive to the second predefined subset of the column address signals and does not need to latch in new address values after the detection of an address signal transition, all the secondary sense amplifiers can be accessed much faster than the other data storage locations in the memory.

8 Claims, 10 Drawing Figures

FIGURE 3    PRECODER

FIGURE 5

FIGURE 6  OUTPUT BUFFER

MEMORY WITH IMPROVED COLUMN ACCESS

The present invention relates generally to both dynamic and static semiconductor memory devices and particularly to an improved system for high speed to preselected sets of memory locations.

BACKGROUND OF THE INVENTION

The most relevant prior art known to the inventors includes (1) a number of dynamic memories which have a static column feature (e.g., Intel's I51C65 64k CMOS dynamic memory and a 64k NMOS dynamic memory by Fujitsu); and (2) a "nibble mode" memory access system described in U.S. Pat. No. 4,344,156 (Eaton et al., 1982) and which the inventors believe to be embodied in the INMOS IMS2600P 64k NMOS dynamic memory.

The purpose of the static column feature in dynamic semiconductor memories is to speed access to data in preselected sets of memory locations.

Dynamic memory devices with a static column feature generally operate as follows. Whenever the device receives a row address, a row of data is latched in a set of sense amps. One sense amp is selected when a column address is received. Changes in the column address are detected with an address transition detector circuit and are responded to by generating one or more clock signals which latch the new address into the device's column decoders to select (i.e., transfer the data to the output stage from) one of the sense amps.

The static column feature can speed access to data in a dynamic memory by eliminating the need to explicitly clock in new column addresses. However, the access to data is slowed by the need to detect a change in the column address. The present invention improves on prior versions of the static column data access feature and thereby substantially speeds access to data in small preselected sets of memory locations.

The nibble mode access system of U.S. Pat. No. 4,344,156 (Eaton et al., 1982) represents a different method of achieving high speed access to a small preselected set of memory locations. In the Eaton patent, a series of N decoders and N data latches are provided for sequentially reading or writing data from successive memory loactions. Thus in the Eaton system, the preselected set of memory locations must be accessed in a predetermined unchangeable order. The present invention uses a different system, preferrably used in combination with a static column feature, which allows random access to the preselected set of memory locations. Other differences and advantages of the present invention will be more readily apparent from the following description of the preferred embodiment.

It is therefore a primary object of the invention to provide an improved memory device and particularly a memory device with improved speed of access to data in preselected sets of memory locations.

SUMMARY OF THE INVENTION

In summary, the invention is a semiconductor memory device having an improved system for randomly accessing a preselected set of memory locations. The invention includes a set of "secondary sense amps" which act as a high speed buffer between the memory's normal sense amps and the memory's data input and output buffers. The secondary sense amps are connected to selected ones of the normal sense amps in accordance with a first predefined subset of the memory's column address signals.

A decoder circuit, which is directly responsive to a second predefined subset of the column address signals, selects one of the secondary sense amps and connects it to the memory's data input and output buffers. Since the decoder is directly responsive to the second predefined subset of the column address signals and does not need to latch in new address values after the detection of an address signal transition, all the secondary sense amps can be accessed much faster than the other data storage locations in the memory.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
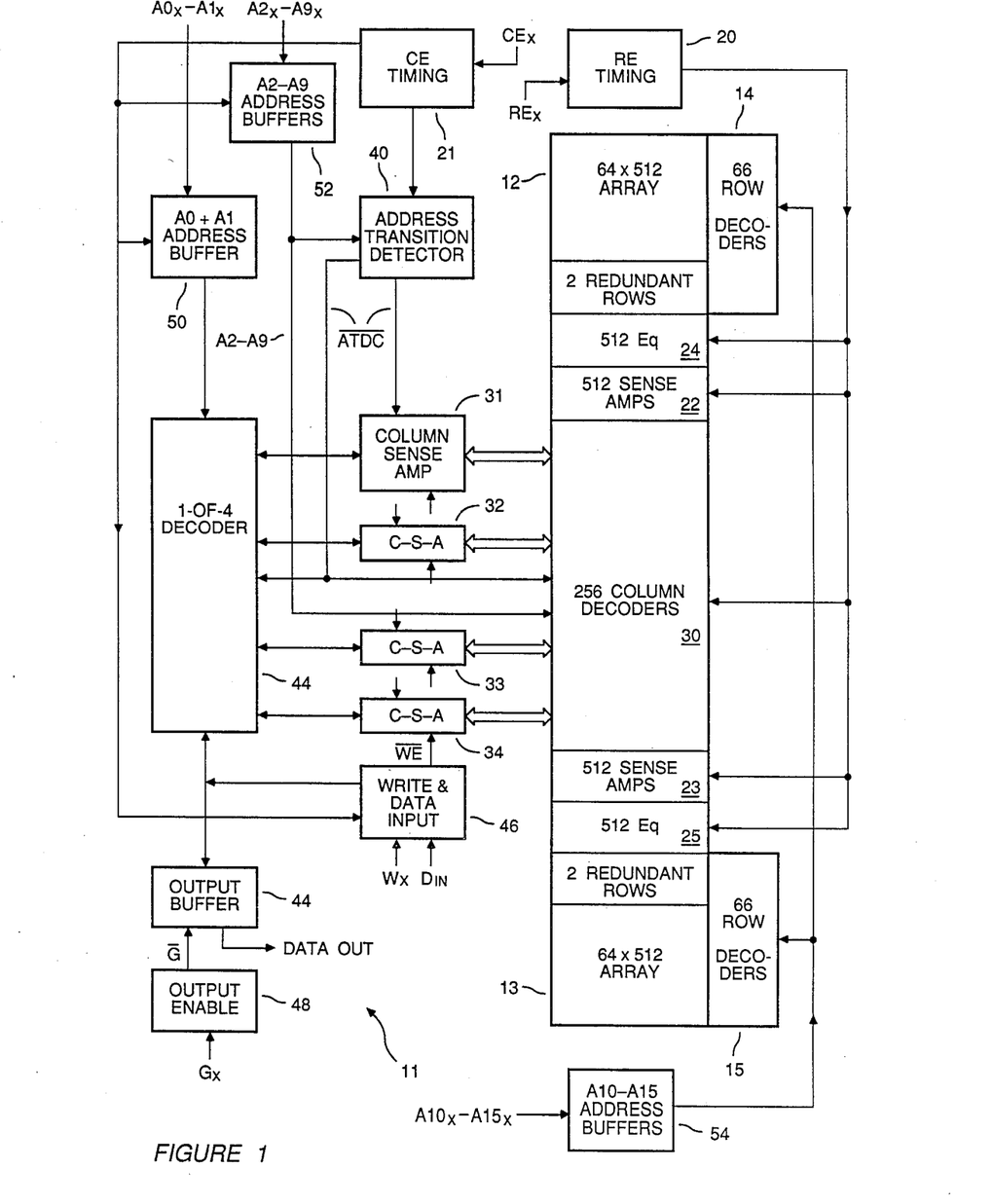
FIG. 1 is a block diagram of a dynamic memory in accordance with the invention.

Referring to FIG. 1, there is shown a semi-dynamic 64k CMOS memory 11. This memory 11 is called semi-dynamic because while the memory array is dynamic and requires refreshing, certain portions of the peripheral memory access circuitry use static CMOS circuits. The use of static circuitry allows the memory cells in each column of the memory to be addressed merely by presenting a column address to the memory 11, without having to explicitly strobe in the column address.

The memory 11 is addressed by address signals A0x to A15x, which are buffered by address buffers 50, 52 and 54. The corresponding internal address signals are labelled A0 to A15. Address signals A10 to A15 are called row address signals and address signals A0 to A9 are called column address signals. Further, the column address signals are divided into low order address signals A0 to A1, and high order address signals A2 to A9.

Note the use of the following signal name conventions. Input signals received by the memory 11 from other circuits have signal names ending in an "x" (e.g., A1x), except for Din—the data input signal. The buffered internal versions of these input signals have the same signal name with the "x" removed. Inverse logic signals, which are active when low are denoted with an overscore (e.g., $\overline{ATDC}$).

The memory 11 can only be accessed after an REx signal causes the chip to latch in the row address signals and the CEx signal becomes active, thereby enabling the operation of the column address buffers 50 and 52.

The RE timing 20 and CE timing 21 circuits provide the signals needed for the dynamic portions of the memory circuit 11. As is typically required with dynamic memories, the row address signals A10 to A15 must be set up a specified amount of time (typically less than ten nanoseconds) before the occurrence of an REx signal and must also be held for a specified amount of time thereafter.

The memory array is split into two subarrays 12 and 13 each having 64 rows of 512 memory cells. The subarrays are addressed by row decoders 14 and 15 which select one row from each set of 64 rows. Each subarray also has 2 redundant rows which can be used to replace rows which have defective cells. Using technology well known to those skilled in the art, the defective rows are isolated and the redundant rows are patched in by the selective breaking of selected predefined connections in the corresponding row decoders using lasers.

After the occurrence of an REx signal, RE timing circuit 20 generates signals which cause a selected row of memory cells (i.e., one memory cell from each column in each array 12 and 13) to be connected to the sense amps 22 and 23 at the end of each column of memory cells. In the preferred embodiment a pair of balanced bit lines is used for each column, and equalizer circuits 24 and 25 are used to balance the voltages in each pair of balanced bit lines when the bit lines are not being used to transfer data.

Since the operation of a dynamic memory array and its row decoder circuitry is well known to those skilled in the art, and since the details of this aspect of the memory are not essential to the invention, those aspects of the memory 11 will not be discussed any further.

At this point 1024 bits of data are being held in 1024 sense amps 22 and 23. Four of these sense amps are selected through the use of 256 column decoders 30, which are responsive to the high order column address signals A2 to A9. That is, the selected column decoder 30 enables simultaneous access to four sense amps.

Whenever one of the A2 to A9 address signals changes, this change is detected by the address transition detector 40, which generates an $\overline{ATDC}$ signal. This causes the column decoders 30 to latch in the current A2 to A9 signal values and to select a new set of four sense amps. Then the data in the selected sense amps is copied into the secondary sense amps 31-34.

Generally, if there are N low order column address signals there will be $2^N$ secondary sense amps.

As will be described in greater detail below with reference to FIG. 4, each secondary sense amp is connected to a sense amp using a connection which is partially static and partially dynamic. The dynamic portion of the connection is used to copy the contents of four selected sense amps into the four secondary sense amps each time a new set of high order column address signals A2 to A9 are latched into the column decoders 30. The static connection is used to transfer new data from the secondary sense amps to the currently selected sense amps.

The secondary sense amps 31-34 are stronger amplifiers than the sense amps. Also, the secondary sense amps are connected by a static connection to the currently selected sense amps, except for a short period of time just after a new set of high order column address signals are received. Therefore new data written into the secondary sense amps are automatically transferred to the sense amps by means of the static connection between them.

A decoder 42 uses the A0 and A1 address signals to determine which one of the four secondary sense amps 31-34 is to be connected to the data input buffer 46 and data output buffer 44.

In the preferred embodiment, the decoder 42 is bidirectional. The connection between the data input buffer 46 and the secondary sense amps is governed by the same decoder which selectively connects one of the secondary sense amps to the data output buffer 44. In fact, as shown in FIG. 1, the output port of the input buffer 46 is connected to the input port of the output buffer 44. Thus new input data will appear at the output of the output buffer 44 if the output buffer is enabled by a Gx signal.

All the secondary sense amps 31-34 can be quickly accessed by quickly varying the low order column address signals A0 and A1 so as to successively address all the secondary sense amps. This form of access is fast because the secondary sense amps are connected to the data input buffer 46 and data output buffer 44 by a simple decoder which is directly responsive to the low order column address signals. Furthermore, since the number of secondary sense amps is generally small, the capacitive load on the low order column address signals is small and these signals can be reliably varied at very high frequencies.

When the Wx signal is active, the Din signal is amplified by input buffer 46 and transferred to the selected secondary sense amp via the decoder 42. From there, the data is automatically copied into the sense amp currently connected to the selected secondary sense amp by the static connection therebetween.

As described above, the secondary sense amps are stronger amplifiers than the normal sense amps, and therefore new data written into a secondary sense amp is automatically replicated in the sense amp attached to the secondary sense amp. From the sense amp, the data is automatically written onto the bit line for that sense amp and then into the memory cell which is currently connected to that sense amp, in accordance with the current row address.

When Wx is inactive, the memory is in READ mode and the selected secondary sense amp is connected to the output buffer 44. The output stage of the selected secondary sense amp is always connected to output buffer 44; but a DataOut output signal reflecting the data in the selected columns sense amp is not generated unless a Gx signal activates output enable circuit 48.

In prior art memories using a static column feature, each time a new column address is received, the column decoders select a single sense amp and transfer its contents to an output buffer. The static column feature speeds memory access by avoiding repetition of the row address sequence when the row address remains unchanged. In the present invention, the static column feature is modified to include another level of buffering which allows even faster memory access.

In the prior art static column memory devices, data access is substantially slower than in this invention because (1) the column address decoders latch in all the column address signals which are used in the decoders; and therefore (2) it is necessary to first detect the occurrence of a column address transition before applying a new column address to the decoders; which (3) is much slower than using a decoder which is directly responsive to the column address signals.

Unfortunately, it is impractical to make column decoders in large scale integrated circuit memories directly responsive to all the column address signals because the capacitive load of the column decoders on the address input buffers would substantially slow down the operation of the memory. Therefore, prior art dynamic memory devices have generally used column decoders which latch in the column address signals and have not used column decoders which are directly responsive to the column address signals.

The current invention combines the advantages of the static column feature with the speed advantage of making the column decoders directly responsive to the column address signals by making only a small portion of the column decoder circuitry directly responsive to the column address signals.

The invention uses the normal memory access time not only to select a static column but also to select a subset of the static column. Then the system responds immediately (i.e., using static circuitry) to the address lines which specify which specific elements of the subset are to be accessed. Therefore all the elements of the selected subset can be accessed, sequentially or otherwise, with access times which are much shorter than if normal column decoders were being used.

Figure 2:
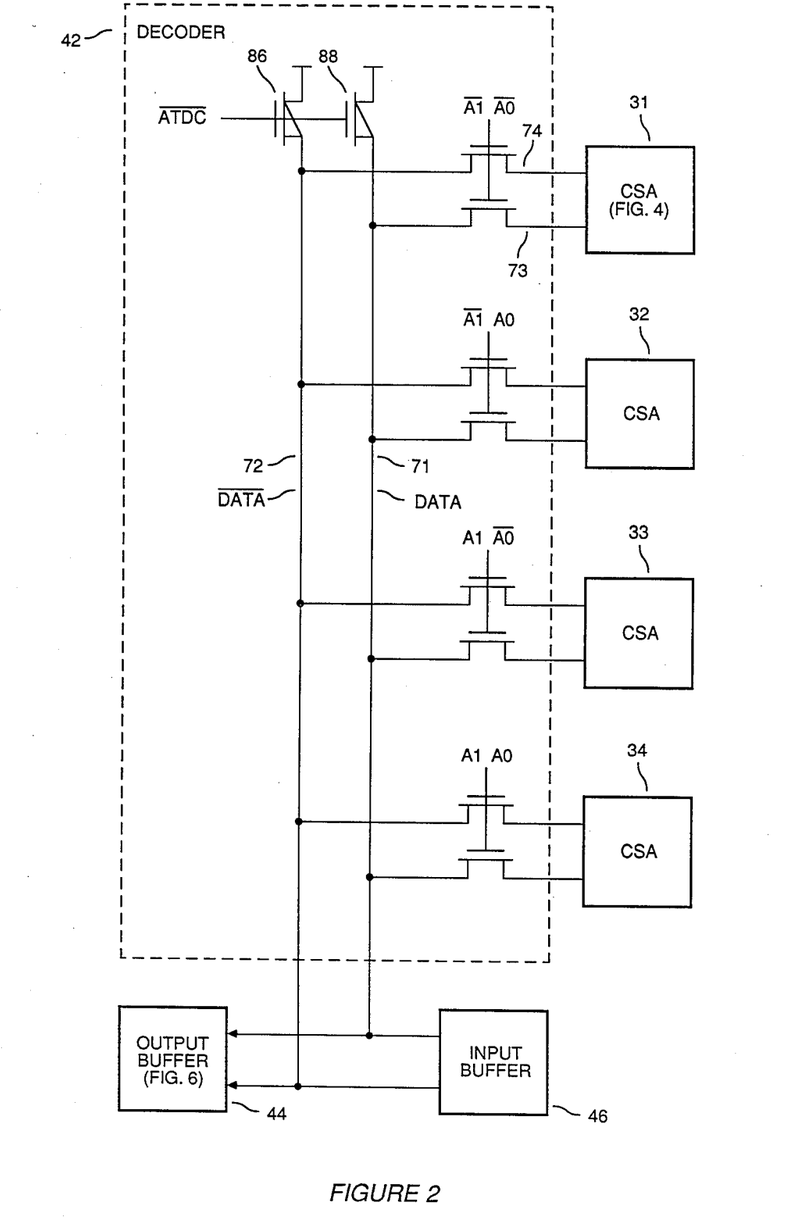
FIG. 2 depicts a decoder circuit used in the preferred embodiment.

Referring to FIG. 2, there is shown a preferred embodiment of the decoder 42. Lines 71 and 72, carrying Data and $\overline{\text{Data}}$ signals, respectively, are connected to only one of the secondary sense amps 31-34 in accordance with the current value of A0 and A1. For instance, data lines 73 and 74 emanating from secondary sense amp 31 are connected to lines 71 and 72 if A1,A0=0,0. Lines 71 and 72 are also connected to the input port of the output buffer 44 and to the output port of the input buffer 46.

As indicated above, the preferred embodiment of the invention is a CMOS dynamic memory. Transistors marked with a slash through the channel are p-channel devices while the other transistors are n-channel devices.

Figure 3:
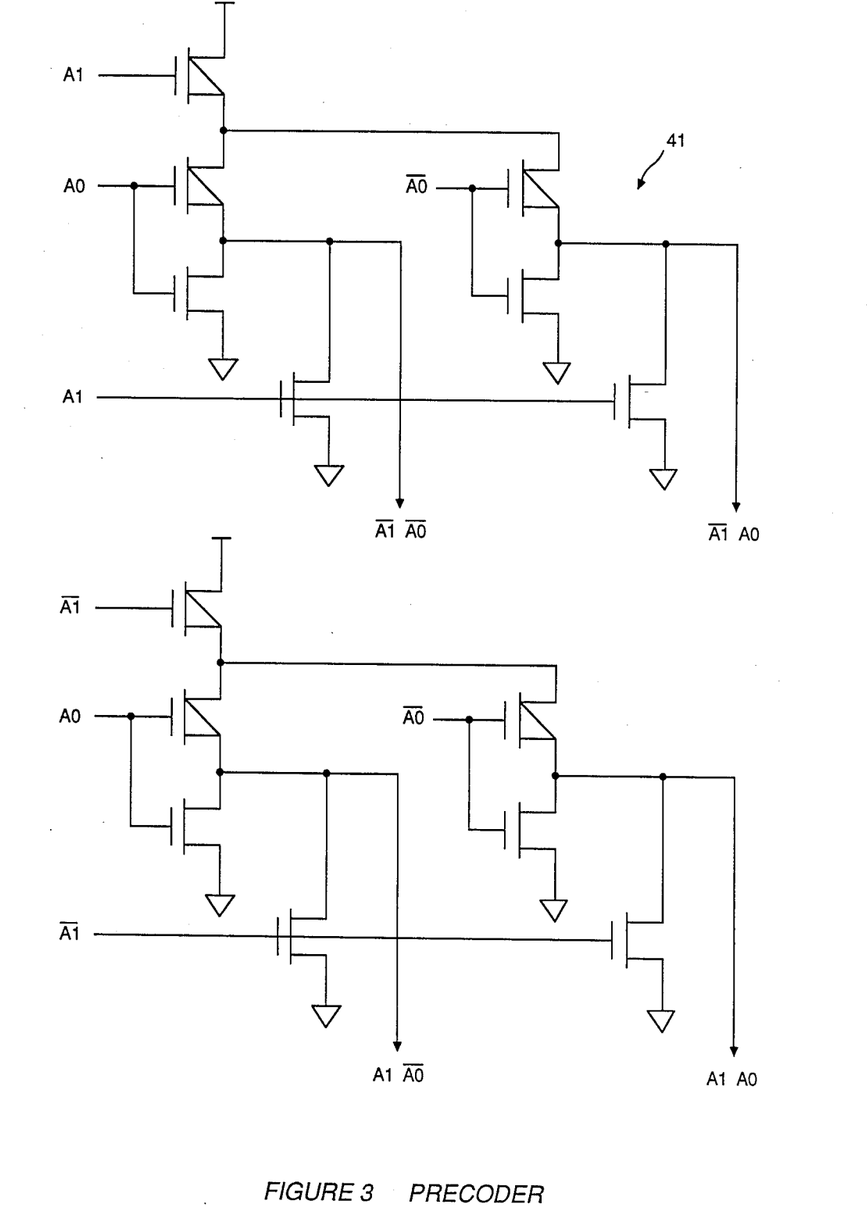
FIG. 3 depicts a predecoder circuit used in the preferred embodiment.

Referring to FIG. 3, there is shown a preferred embodiment of the predecoder circuit 41 used to develop the $\overline{\text{A1A0}}$, $\overline{\text{A1}}$A0, A1$\overline{\text{A0}}$, and A1A0 signals used in the decoder 42 shown in FIG. 2. As can be seen, the predecoder 41 is a static CMOS circuit which is directly responsive to the A0, $\overline{\text{A0}}$, A1, and $\overline{\text{A1}}$ address signals from the A0 and A1 address buffer 50.

Figure 4:
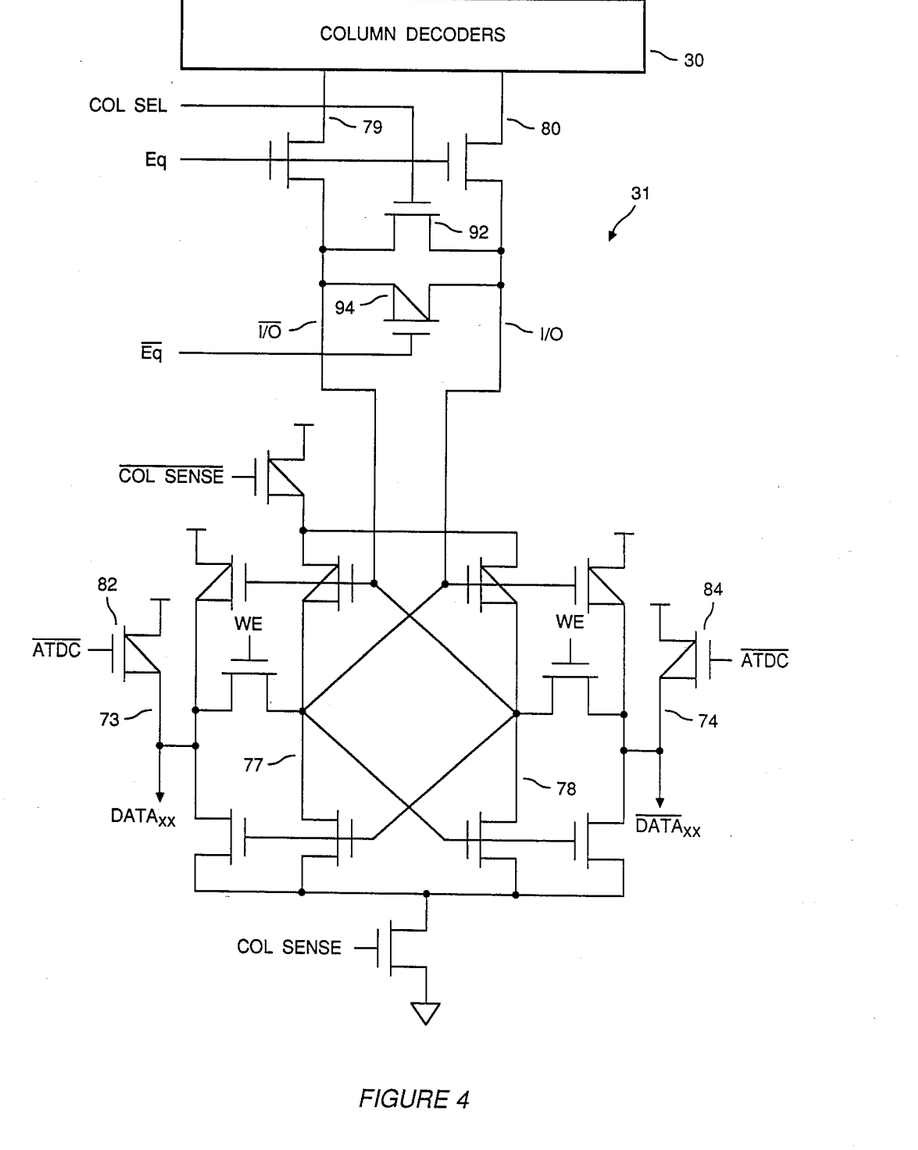
FIG. 4 depicts a secondary sense amp circuit used in the preferred embodiment.
Figure 5:
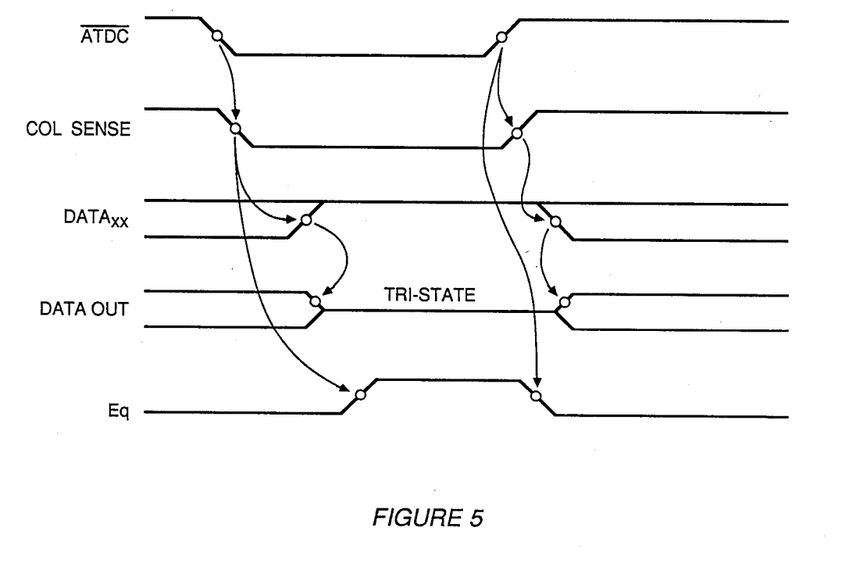
FIG. 5 is a timing diagram related to the operation of the secondary sense amp.

Referring to FIGS. 4 and 5, there is shown a preferred embodiment of a secondary sense amp 31 and a related timing diagram. Normally, after CEx has become active and the high order column address signals A2-A9 are steady, the Col.Sel signal is active and therefore the secondary sense amp 31 is connected to the bit lines 79 and 80 leading to the column decoders 30. Therefore when $\overline{\text{WE}}$ becomes active and new data (from the Dataxx and $\overline{\text{Dataxx}}$ lines) is read into nodes 77 and 78 of the secondary sense amp 31, the new data is automatically transferred to the bit lines 79 and 80. Since, as described above, the secondary sense amp 31 is a more powerful amplifier than the sense amps 22 and 23, the new data in the secondary sense amp is replicated in the corresponding sense amp and from there is copied into the memory array 12 or 13.

Whenever CEx is activated or a new high order column address is detected by the address transition detector 40, the data in the selected sense amps must be transferred to the secondary sense amps. In order to do this, the follow signals are generated.

First, the $\overline{\text{ATDC}}$ signal is activated (i.e., goes low), which causes the Col.Sense, $\overline{\text{Col.Sense}}$, and Col.Sel signals to become inactive. Only the Col.Sense signal is shown in the timing diagram of FIG. 5 because the $\overline{\text{Col.Sense}}$ and Col.Sel signals have similar timing characteristics to the Col.Sense signal (except, of course, that the $\overline{\text{Col.Sense}}$ signal is the complement of the Col.Sense signal).

Furthermore, the $\overline{\text{ATDC}}$ signal causes the Dataxx, $\overline{\text{Dataxx}}$, Data, and $\overline{\text{Data}}$, signals to all be precharged. See transistors 82 and 84 in FIG. 4 and transistors 86 and 88 in FIG. 2. As will discussed below with reference to FIG. 6, when both Data and $\overline{\text{Data}}$ are precharged the DataOut signal is tri-stated.

The inactive Col.Sel signal isolates the secondary sense amps from the sense amps. The deactivation of Col.Sense and $\overline{\text{Col.Sense}}$ prepares the secondary sense amp 31 to latch in new information from bit lines 79 and 80.

After the Col.Sense signals become inactive, the Eq and $\overline{\text{Eq}}$ are momentarily activated (e.g., for about 10 nanoseconds) so that nodes 77 and 78 are equalized at approximately one half Vcc (the supply voltage).

Then, shortly after the Eq and $\overline{\text{Eq}}$ signals become active, the $\overline{\text{ATDC}}$ signal is deactivated, thereby initiating the second half of the data read process. The deactivation of the $\overline{\text{ATDC}}$ signal causes the Col.Select, Col.Sense and $\overline{\text{Col.Sense}}$ signals to become active, and the Eq and $\overline{\text{Eq}}$ signal to become inactive. This causes the data on bit lines 79 and 80 to be replicated on nodes 77 and 78.

The Col.Sel signal remains active, maintaining the static link between the secondary sense amp 31 and the corresponding sense amp selected by the column decoders 30.

Figure 6:
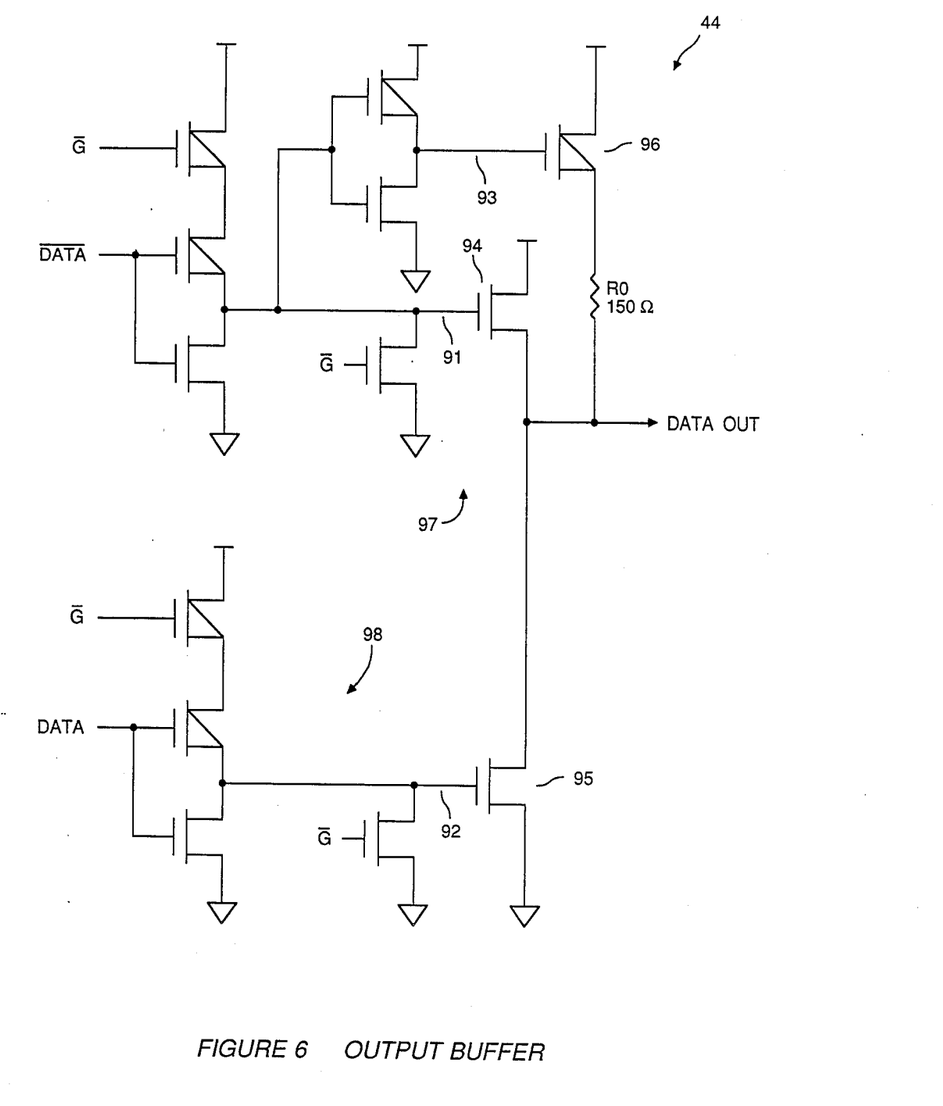
FIG. 6 depicts the data output buffer circuit used in the preferred embodiment.

Referring to FIG. 6, there is shown a preferred embodiment of the output buffer 44. The buffer 44 is operative only when $\overline{\text{G}}$ is active (i.e., low). When $\overline{\text{G}}$ is inactive (i.e., high) nodes 91 and 92 are low and node 93 is high, thereby turning off transistors 94, 95 and 96 and tri-stating the DataOut line.

Output buffer 44 works by deactivating the top portion of the circuit 97 when $\overline{\text{Data}}$ is active and deactivating the bottom portion of the circuit 98 when Data is active. Therefore when both Data and $\overline{\text{Data}}$ are active, both portions 97 and 98 of the output buffer are deactivated, and thus the DataOut line is neither driven high or low. As discussed above with reference to FIG. 4, Data and $\overline{\text{Data}}$ are both momentarily active when data is being transferred from the sense amps 22 and 23 to the secondary sense amps 31-34.

Figure 7:
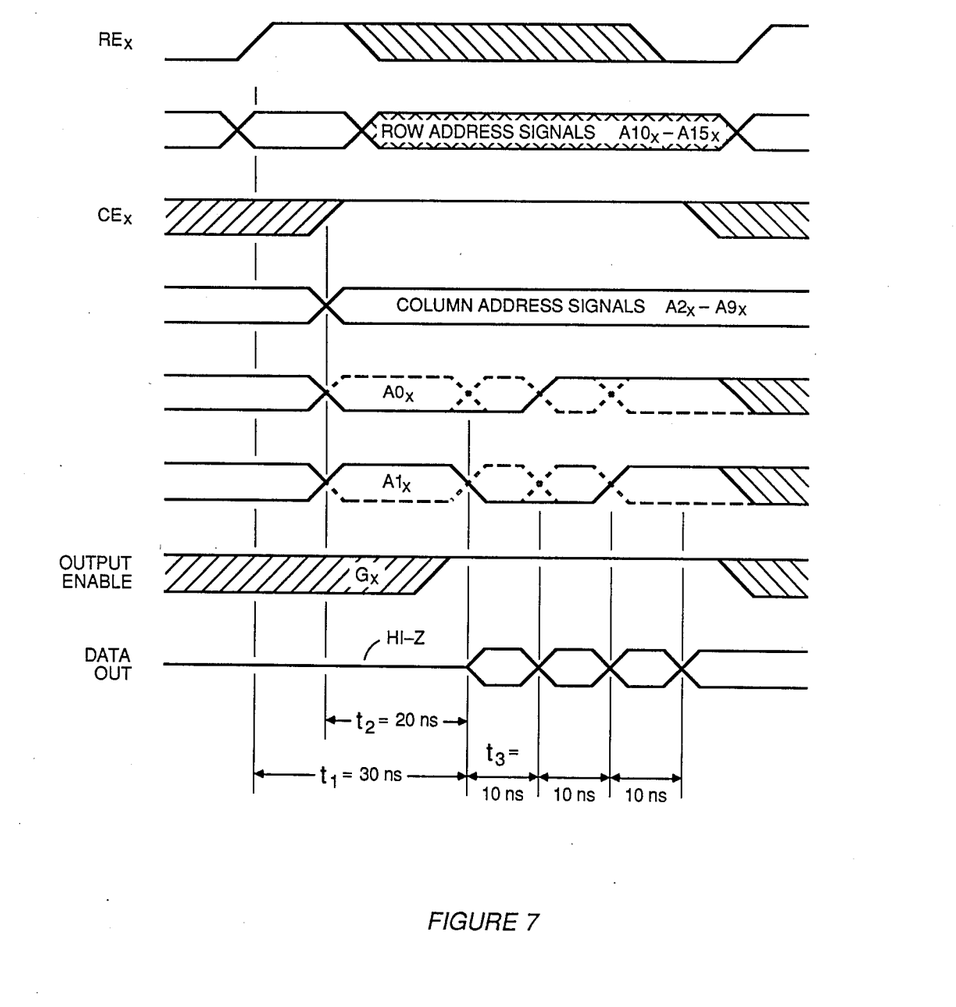
FIGS. 7 and 8 are timing diagrams demonstrating the operation of the invention.

Referring to FIG. 7, there is shown a timing diagram demonstrating the operation of the invention. As shown, access is timed either from the occurrence of an REx signal (t1), a change in the high order column address (t2) or the low order column address (t3). In the preferred embodiment, the access time (t1) from the occurrence of an REx signal is 30 nanoseconds.

If the high order column address changes, the change must be detected by the address transition detector 40 and a new set of sense amps must be connected to the secondary sense amps 31-34. In the preferred embodiment, this access takes about 20 nanoseconds (t2). If only the low order column address changes, the decoder responds directly to the change and data at the new address is accessed in about 10 nonseconds (t3).

An output data signal DataOut is generated if the output buffer 44 is enabled by a Gx signal.

Figure 8:
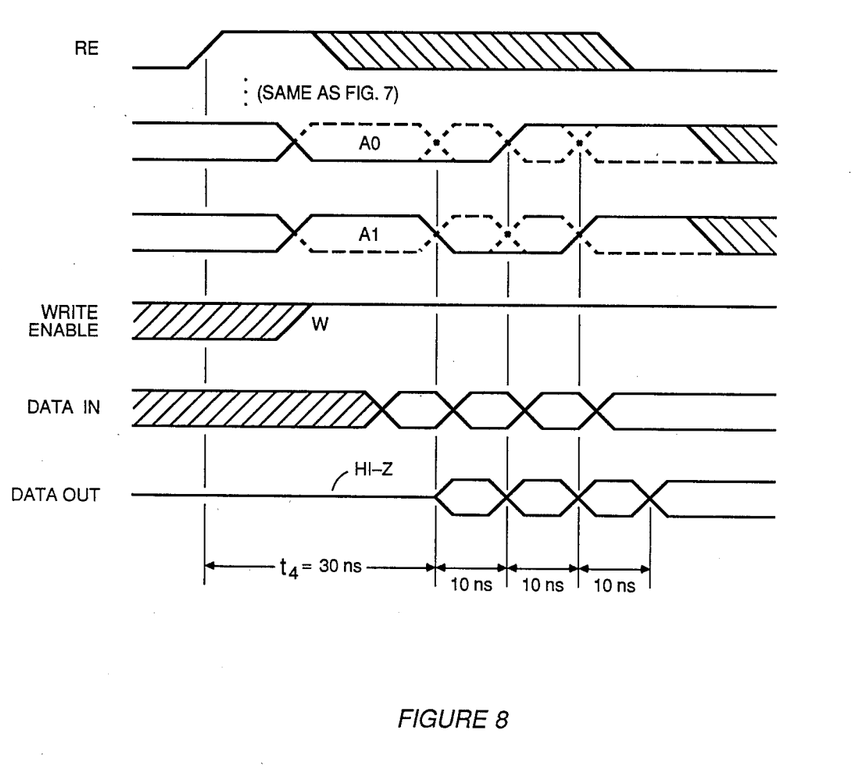

Referring to FIG. 8, data is written into the memory only if a Wx signal enables the receipt of data. As with the reading of data, the rate of access depends on whether changes in the address include changes in the row address signals A10x to A15x and/or the high order column address signals A2x to A9x, or only changes in the low order column address signals A0x to A1x.

Figure 9:
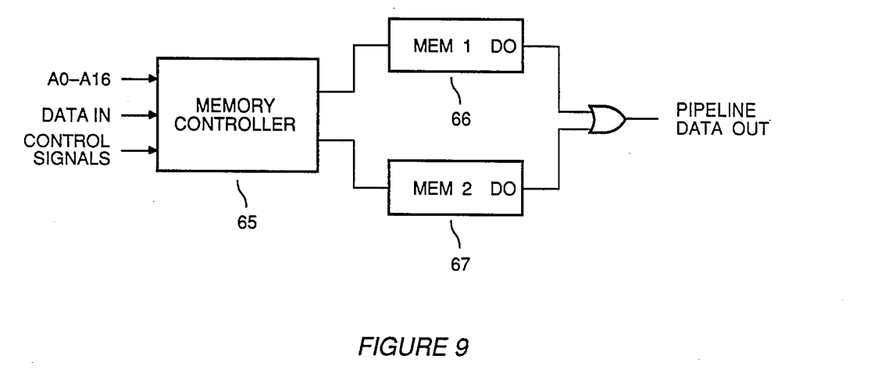
FIG. 9 is a block diagram demonstrating the interleaving of two dynamic memories in accordance with the invention to achieve a maximum rate of data access.
Figure 10:
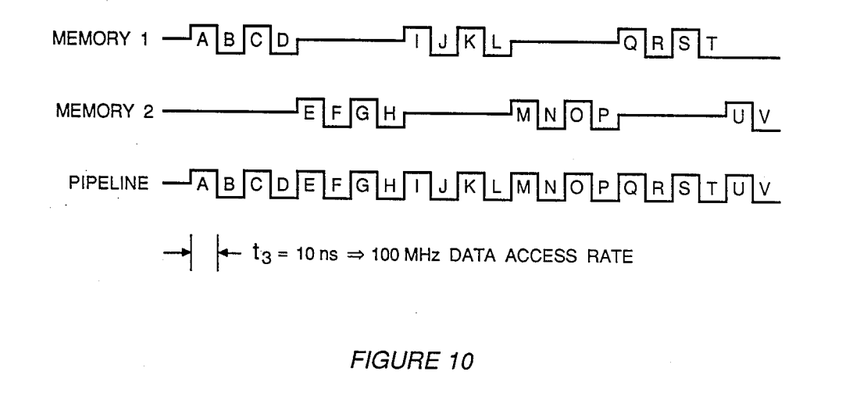
FIG. 10 is a timing diagram corresponding to the operation of the circuit shown in FIG. 6.

Referring to FIGS. 9 and 10, two memories 66 and 67 can be interleaved to allow continuous memory access at the maximum data rate associated with changes only in the low order column address signals. While one memory is being addressed with a new address that includes at least one change in the row and/or high order column address, the second memory is accessed in the high speed mode with only the low order column address signals being varied. By the time that the secondary sense amps of the second memory have been all accessed, the first memory is ready for high speed data access and the two memories switch roles.

In this way the two memories are interleaved and continual high speed data access is maintained. Using a 10 nanosecond data access time, a data access rate of 100 MHz is achieved, which is more than sufficient to drive a a high resolution display, for example a 768 by 1024 pixel raster scan display, even with a refresh rate of 60 times per second.

As will be understood by those skilled in the art, such interleaved use of two memory chips 66 and 67 can be achieved using a memory controller circuit 65 using standard memory control techniques.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For instance, the invention could be used in a memory with parallel bit access. In such an application, there would be an identical set of secondary sense amps for each bit which is simultaneously accessed.

In a simple modification of the preferred embodiment, the invention could use three or more low order column addresses. Generally, if there are N low order column address signals there will be $2^N$ secondary sense amps.

Further, the invention is applicable to dynamic memory technologies other than CMOS.

What is claimed is:

1. In a semiconductor memory device having:
    a multiplicity of data storage locations arranged in rows and columns, said storage locations being addressed by a plurality of binary address signals; said address signals being divided into row address signals and column address signals; said column address signals being further divided into low and high order column address signals;
    a set of sense amplifiers for latching and transferring data to and from a selected row of said data storage locations; and
    data input and output buffers for receiving and transmitting data;
    the improvement comprising:
    a plurality of secondary sense amplifiers for latching and transferring data to and from selected ones of said sense amplifiers, said sense amplifiers being selected in accordance with said high order column address signals; and
    decoder means responsive to said low order column address signals for selecting one of said secondary sense amplifiers and connecting it to said data input and output buffers.

2. A memory device as set forth in claim 1, wherein said memory device is a dynamic memory device;
    further including static column means comprising:
    address transition detection means for detecting a change in any of said said high order column address signals and for generating an address transition signal in response to any such change; and
    column decoder means, responsive to said address transition signal, for connecting said secondary sense amplifiers to selected ones of said sense amplifiers in accordance with the current signal values of said high order column address signals.

3. A memory device as set forth in claim 2, wherein said decoder means is responsive to said low order column address signals; and
    said column decoder means is responsive to changes in said high order column address signals only after said address transition detection means generates said address transition signal.

4. A memory device as set forth in claim 1, said low order column address signals including at least two address signals.

5. A memory device as set forth in claim 1, further including:
    write enable means, responsive to a write enable signal, for connecting said data input buffer to said decoder means, and thereby enabling the transfer of data from said input buffer through said decoder means into the secondary sense amplifier corresponding to the current value of said low order column address signals.

6. In a method of operating a dynamic memory device; said device having:
    a multiplicity of data storage locations arranged in rows and columns, said storage locations being addressed by a plurality of binary address signals; said address signals being divided into row address signals and column address signals; said column address signals being further divided into low and high order column address signals;
    a set of sense amplifiers for latching and transferring data to and from a selected row of said data storage locations; and
    data input and output buffers for receiving and transmitting data;
    the steps of:
    providing a plurality of secondary sense amplifiers;
    transferring data between said secondary sense amplifiers and selected ones of said sense amplifiers, said sense amplifiers being selected in accordance with said high order column address signals; and
    selecting one of said secondary sense amplifiers in accordance with said low order column address signals and connecting it to said data input and output buffers.

7. In the method of claim 6, the additional steps of:
    detecting a change in any of said said high order column address signals and generating an address transition signal in response to any such change; and in response to said address transition signal, connecting said secondary sense amplifiers to selected ones of said sense amplifiers in accordance with the current signal values of said high order column address signals;

wherein said selecting step is directly responsive to said low order column address signals.

8. In the method of claim 7, the additional step of:

in response to the receipt of a write enable signal, enabling the writing of data into said memory by selecting one of said secondary sense amplifiers in accordance with said low order column address signals and connecting it to said data input buffer.

* * * * *

UNITED STATES PATENT AND TRADEMARK OFFICE
CERTIFICATE OF CORRECTION

PATENT NO. : 4,719,602

DATED : January 12, 1988

INVENTOR(S) : Mohammed E. U. Haq and Peter J. Bagnall

It is certified that error appears in the above—identified patent and that said Letters Patent is hereby corrected as shown below:

On the title page, after "Inventors:", replace Hag with Haq.

Signed and Sealed this

Nineteenth Day of July, 1988

Attest:

DONALD J. QUIGG

*Attesting Officer*   *Commissioner of Patents and Trademarks*